(12) United States Patent
Peng et al.

(10) Patent No.: US 11,978,816 B2
(45) Date of Patent: May 7, 2024

(54) THIN FILM DEVICE WITH ADDITIONAL CONDUCTIVE LINES AND METHOD FOR PRODUCING IT

(71) Applicants: China Triumph International Engineering Co., Ltd., Shanghai (CN); CTF Solar GmbH, Dresden (DE)

(72) Inventors: Shou Peng, Shanghai (CN); Michael Harr, Dresden (DE); Xinjian Yin, Shanghai (CN); Ganhua Fu, Dresden (DE); Krishnakumar Velappan, Dresden (DE); Bastian Siepchen, Dresden (DE)

(73) Assignees: China Triumph International Engineering Co., Ltd., Shanghai (CN); CTF Solar GmbH, Dresden (DE)

( * ) Notice: Subject to any disclaimer, the term of this patent is extended or adjusted under 35 U.S.C. 154(b) by 500 days.

(21) Appl. No.: 16/768,705

(22) PCT Filed: Nov. 30, 2017

(86) PCT No.: PCT/CN2017/113982
§ 371 (c)(1),
(2) Date: Jun. 1, 2020

(87) PCT Pub. No.: WO2019/104653
PCT Pub. Date: Jun. 6, 2019

(65) Prior Publication Data
US 2021/0013352 A1    Jan. 14, 2021

(51) Int. Cl.
*H01L 31/0463* (2014.01)
*H01L 31/0224* (2006.01)
*H01L 31/18* (2006.01)

(52) U.S. Cl.
CPC .. *H01L 31/0463* (2014.12); *H01L 31/022466* (2013.01); *H01L 31/1884* (2013.01)

(58) Field of Classification Search
CPC ...................... H01L 31/0463; H01L 31/0465
See application file for complete search history.

(56) References Cited

U.S. PATENT DOCUMENTS

| 5,032,527 A | * | 7/1991 | Maeba | H01L 31/0463 257/E27.125 |
| 2011/0008926 A1 | * | 1/2011 | Irvin | H10K 77/10 438/82 |
| 2014/0090685 A1 | * | 4/2014 | Magalhaes Mendes | H01G 9/2022 438/73 |

* cited by examiner

Primary Examiner — Angelo Trivisonno
(74) Attorney, Agent, or Firm — IPRTOP LLC

(57) ABSTRACT

Object of the invention is to provide a new thin film device comprising at least one thin film cell, wherein the thin film cell comprises a first electrode, a photoactive layer and a second electrode, wherein the photoactive layer is arranged between the first and the second electrode, wherein at least one additional conductive line is arranged within an active area of the thin film cell and included in the photoactive layer and electrically interconnected with the first electrode and electrically insulated from the second electrode. Furthermore, the invention provides a method of forming a thin film device comprising at least one thin film cell, wherein the thin film cell comprises a first electrode, a photoactive layer and a second electrode and the photoactive layer is arranged between the first and the second electrode.

7 Claims, 3 Drawing Sheets

Figure 1:
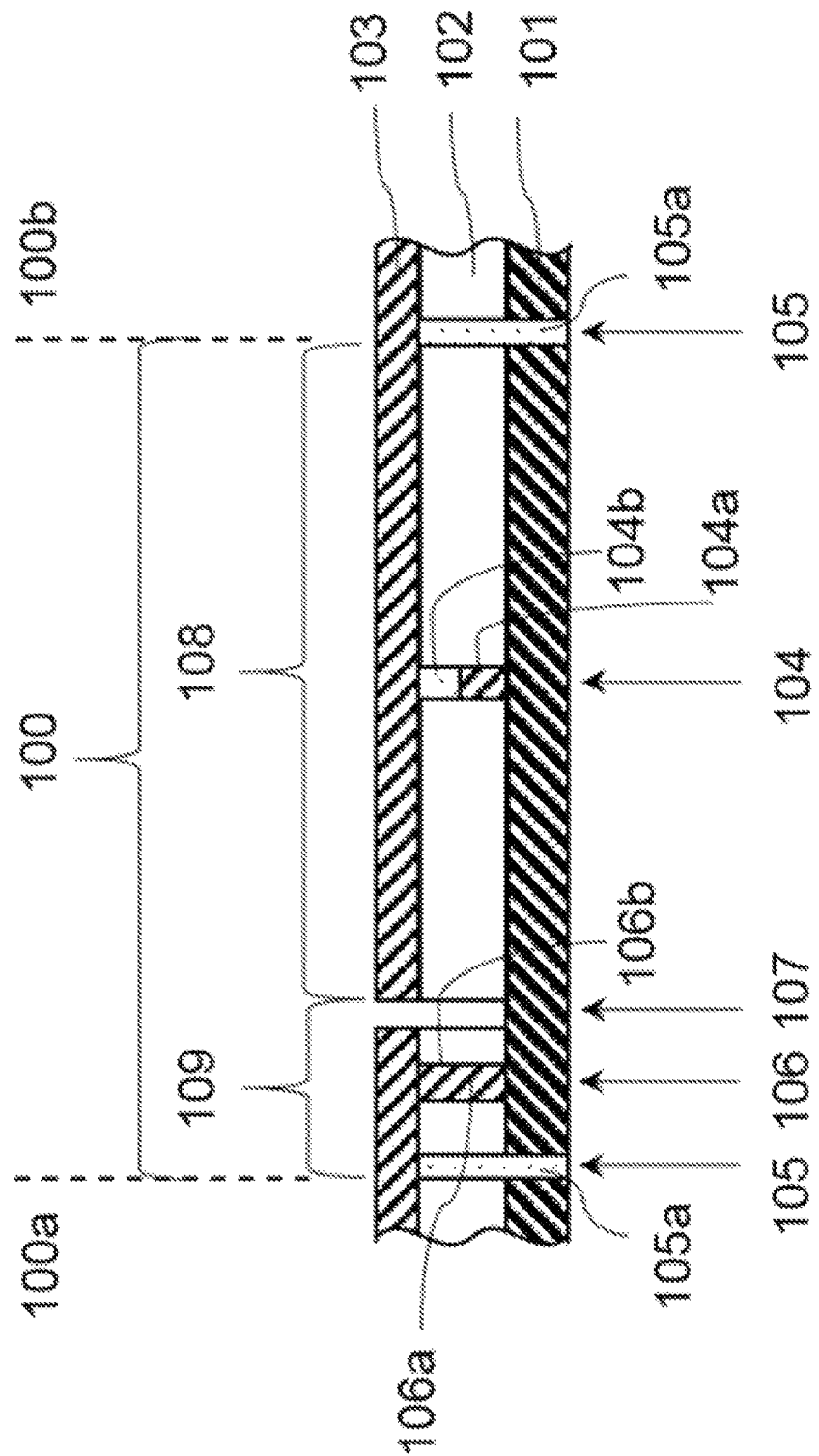

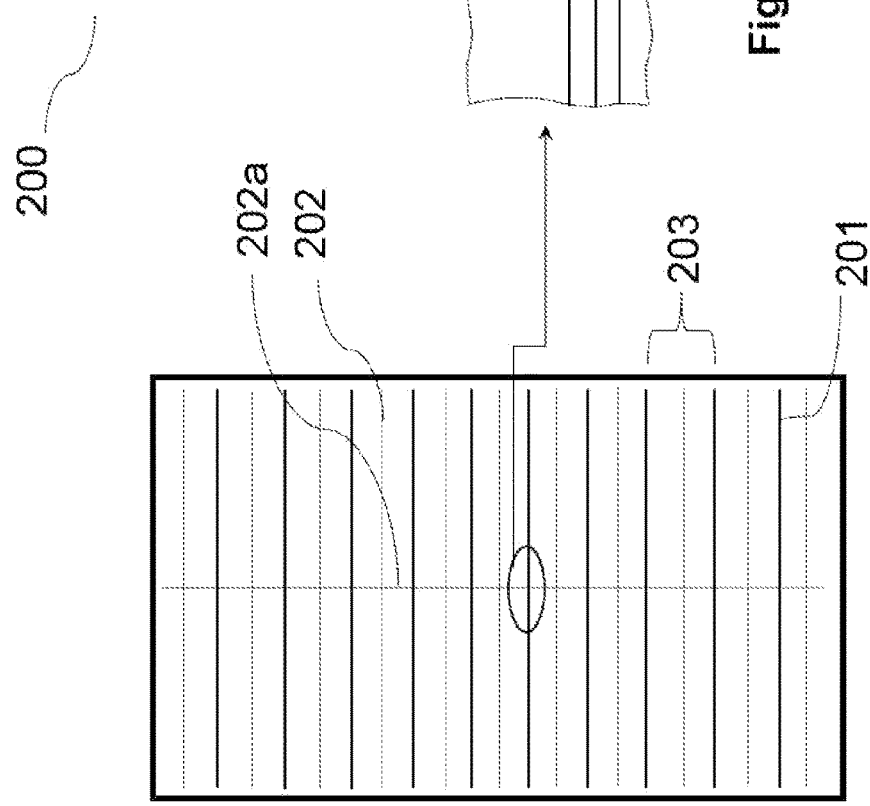
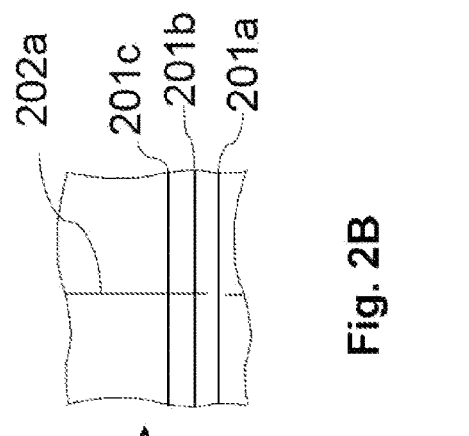
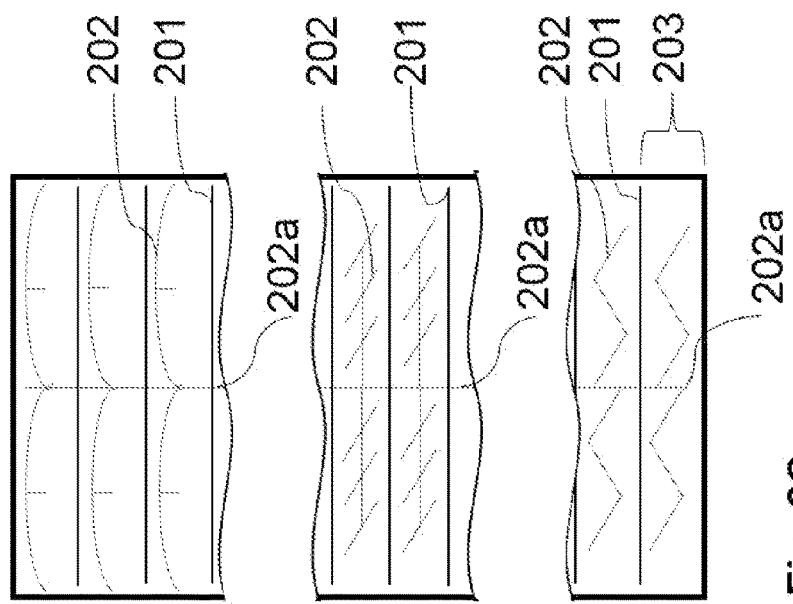
Fig. 2A
Fig. 2B
Fig. 2C

THIN FILM DEVICE WITH ADDITIONAL CONDUCTIVE LINES AND METHOD FOR PRODUCING IT

The present invention describes a new thin film device and a method for manufacturing such thin film device. In particular, the invention describes a thin film device which comprises a first electrode, a photoactive layer and a second electrode with additional conductive lines formed within an active area of the device and included in the photoactive layer and electrically connected to the first electrode.

Thin film devices, like thin film solar cells, usually comprise a first electrode, at least one photoactive layer and a second electrode. The thin film solar cell device may include one or more buffer layers between the electrode layers and the photoactive layer. In thin film solar cells, the electrode which faces sunlight is usually made of a transparent material, to enable passing of sunlight into the photoactive layer. The first and the second electrode of the thin film solar cell serve as contact electrodes for discharging generated charge carriers. The whole current, which is produced in the thin film solar cell is conveyed by the transparent conductive material. Transparent conducting oxides (TCO) are mostly used as transparent conductive electrodes in thin film devices, like thin film solar cells, touch screens or liquid crystal displays. Commonly used TCOs are indium tin oxide (ITO) and fluorine tin oxide (FTO), aluminium doped zinc oxide (AZO) or any other doped or undoped binary or ternary oxides, which exhibit sheet resistances in the order of 8 to 17$\Omega/\square$ and average transmittance above 82% in the visible range.

High sheet resistance of the transparent electrode material hinders the efficiency of the thin film solar cell or module, expressed by a low filling factor. In order to reduce losses and enhance the conductivity of the transparent electrode material, different technologies have been developed.

One way to increase the TCO conductivity is to incorporate metal lines between TCO layers as a sandwich layer (TCO/metal/TCO) [1]. However, such fine patterned structure is difficult to realize in thin film module production, moreover it will not withstand successive high temperature process steps of cell production.

US 2014/0090685 A1 describes a process for the manufacture of dye-sensitized solar cell modules by improving the conductivity of the glass substrate coated with a transparent conductive oxide, through incorporation of a conductive mesh between the insulating substrate and the transparent conductive oxide electrode. The conductive mesh can either be inserted in grooves drawn in the naked glass substrate and then coated with a transparent conductive oxide or directly printed over the glass substrate.

Connecting a plurality of thin film solar cells to a thin film module is used to adjust the electrical output parameters of the thin film module. Higher voltages can be achieved by series connection of the individual thin film cells, while parallel connection reaches higher current levels of the thin film module.

Usually, the layers serving as the first electrode, the photoactive layer and the second electrode are formed as continuous layers for all thin film cells and individual cells as well as a serial or a parallel connection of the individual cells are formed by a structuring process. Series connection of the plurality of thin film cells is usually done by a three-stage structuring process integrated in the thin film module manufacturing process.

The three-stage structuring process may be performed by a laser scribing process, a mechanical scribing process and/or chemical etching or combinations thereof and results in three parallel scribed lines each per thin film cell. These three scribed lines divide the area of each thin film cell into an "active area", where generation of charge carriers takes place, and a "dead area" or scribing region, where no charge carrier generation takes place and where the three scribed lines are located in.

For example, according to state of the art, the laser scribing process comprises forming three different laser scribed lines, known as "P1", "P2" and "P3" scribe, to monolithically interconnect the individual thin film cells in series within the thin film module. The three scribed lines extend perpendicular to the direction of the current flow within the thin film module and parallel to each other with a typical width of about 30 to 50 µm each, resulting in a 140 to 300 µm wide scribing region ("dead area") within each thin film cell the thin film module comprises of. The first scribed line (known as "P1" scribe) penetrates at least the layer of the first electrode and separates the first electrodes of individual thin film cells, wherein the first electrodes are made of a transparent conductive material. The second scribed line (known as "P2" scribe) through the photoactive layer forms, after filling with a conductive material, a contact line to electrically connect adjacent thin film cells in series. In the result, the first electrode of the first thin film cell is electrically connected to the second electrode of the second neighboring thin film cell. The third scribed line (known as "P3" scribe) through at least the second electrode separates the second electrodes of individual thin film cells. The width of each thin film cell is defined by the sum of the width of one set of three scribed lines, known as scribing region or "dead area", and of the width of the "active area" of the thin film cell. Thus, the width is defined as the extension of a thin film cell along the direction into which different cells connected in series are arranged consecutively and in which the current flows within the thin film module. The length of the individual thin film cell extends perpendicular to the width of the thin film cell.

The voltage produced by the thin film solar cell depends on the photoactive material used within the thin film solar cell and can be varied by changing the photoactive material. The current produced by the thin film solar cell depends on the area of the "active area" of the thin film solar cell and in particular on the width of the "active area".

The module output voltage is depending on the number of active solar cells in a module and as well as the mode of string connection such as serial or parallel connection of string(s) and the combination thereof. A string can include multiple numbers of cells connected in series.

The high sheet resistance of the first electrode causes resistance losses and limits the possible width of an individual thin film solar cell. However, a small width of a thin film solar cell results in higher module output voltage due to the increased number of cells in series with reduced module output current. Such high voltage modules are undesirable for solar park construction as it would limit the number of module connection in series. Furthermore, since several sets of three scribed lines are needed to reduce cell width and to connect individual thin film solar cells, the total "active area" of the thin film module is reduced.

Disadvantageous the output parameters of the thin film module are not freely adjustable.

The object of the present invention is to provide a new thin film device and a method for manufacturing such thin film device, which reduces disadvantages resulting from the high sheet resistance of a transparent electrode material.

This object is achieved by the thin film device according to claim 1 by means of including additional conductive lines and by the method according to claim 12, advantageous embodiments are disclosed in the dependent sub-claims.

The new thin film device comprises at least one thin film cell, wherein the thin film cell comprises a first electrode, a photoactive layer and a second electrode, wherein the photoactive layer is arranged between the first and the second electrode and at least one additional conductive line is arranged within an"active area" of the thin film cell and included in the photoactive layer and electrically connected with the first electrode and electrically insulated from the second electrode. The "active area" of a thin film cell is that lateral (in a top view) region, where a photoelectric conversion takes place. If the thin film device is a solar cell, generation of charge carriers takes place in that region.

Electrically connected means that there is a direct physical contact enabling current flow. Electrically insulated means that there is no direct physical contact and a current flow under normal electrical conditions usually present at the thin film device is prevented.

The thin film device may be a thin film solar cell, independent of the type of the photoactive layer used, like cadmium telluride (CdTe), any other CdTe absorber derivatives which include suitable elements in CdTe either as dopant or alloy (CdZnTe, CdTe:Se etc.), copper indium gallium selenide (CIGS), thin film silicon, Kesterites, Perovskites, conductive organic polymers, small organic molecules or combinations thereof, wherein individual thin film solar cells are connected in series and/or parallel within a thin film solar module comprising a plurality of thin film solar cells.

The thin film device may be a multi-junction thin film solar cell. Multi-junction thin film solar cells comprise two or more thin film solar cells or photoactive layers stacked on top of each other. In a further embodiment, the photoactive layer may be composed of any semiconducting material, which converts incident sunlight into electrical energy and is therefore suitable for the use in thin film solar cells. Photoactive materials may be thin film silicon, including amorphous, hydrogenated amorphous, microcrystalline or crystalline silicon, III-V semiconductors like gallium arsenide, II-VI semiconductors, like cadmium telluride, I-II-VI semiconductors, like copper indium gallium selenide, Kesterites, Perovskites, organic semiconductors or combinations thereof. The photoactive layer may also be a layer stack of different photoactive materials.

The thin film device may also be a light emitting device, e.g. a light emitting diode or a display comprising a plurality of light emitting devices.

The first and the second electrode may be composed of the same electrical conductive material or of different electrical conductive materials. Electrical conductive materials may be any electrical conductive material, like metals, metal alloys, conductive oxides or combinations thereof. In an embodiment, the electrical conductivity of the first electrode is smaller than the electrical conductivity of the second electrode. The electrode layer may also be a layer stack, comprising conducting layers, semi-conducting buffer layers, suitable elemental diffusion barrier layers and/or high resistive buffer layers. In a further embodiment, the first electrode is made of a transparent conductive material. Preferably, the transparent conductive material comprises a transparent conductive oxide (TCO) and may be any known transparent conductive oxide to the person skilled, e.g. indium tin oxide (ITO), aluminium doped zinc oxide (AZO) or any other doped or undoped binary or ternary oxides.

In a further embodiment, the second electrode is made of a metal or metal alloy, e.g. molybdenum, nickel or chromium.

In a further embodiment, the thin film device according to the present invention comprises a plurality of thin film cells, which are connected in series to a thin film module by electrically connecting the first electrode of a first cell with the second electrode of a second cell by a contact line.

According to the invention, the resistance losses and corresponding loss in filling factor of the thin film solar cell due to the sheet resistance of the transparent conductive material are reduced without reducing the thin film cell width, by including at least one additional conductive line within the "active area" of the thin film cell. The "active area" of the individual thin film cell is slightly decreased compared to a thin film module without at least one additional conductive line within the "active area" and with the same width of the individual thin film cell. The "dead area" of the thin film cell is slightly increased by the width of the additional conductive line due to the additional conductive line and results in a loss in short circuit current. However, and advantageously, a gain in filling factor is observable, since generated charge carriers are collected by the at least one additional conductive line and transferred to the first electrode. This effect overcompensates the increase in "dead area".

Furthermore, by arranging at least one additional conductive line within the "active area" of the individual thin film cell, the width of the individual thin film cells can be increased and therefore the total "dead area" of the thin film cell and of the thin film module can be decreased. Advantageously, the total "dead area" of the thin film module is reduced to 2%-70% of the dead area without the additional conducting line, preferably to 50% of the dead area without the additional conducting line.

Advantageously, including at least one additional conductive line within the "active area" of the thin film cell enables adjusting the size of the thin film cell to the electrical output parameters of the thin film module desired by the user of the module.

The at least one additional conductive line may be arranged within the "active area" in any way suitable for collecting generated charge carriers and reducing resistance losses of the first electrode.

In one embodiment, the at least one additional conductive line is arranged parallel to one set of three scribed lines, preferably in the middle of the "active area" of the thin film cell.

In a further embodiment, the at least one additional conductive line has a length of 1 to 100% of the length of the structuring scribes, preferably at least 50% of the length of the structuring scribes. In a special embodiment, the at least one additional conductive line has the same length as the structuring scribes.

In a further embodiment, the at least one additional conductive line is a straight or curved line.

In a further embodiment, more than one additional conductive line is included in the "active area" of the thin film cell.

In a further embodiment, two additional conductive lines are arranged within the "active area" of the thin film cell, wherein a first additional conductive line is arranged parallel to the three scribed lines and a second additional conductive line is arranged perpendicular to the three scribed lines, so that the first and the second additional conductive line intersect each other.

In a further embodiment, the first additional conductive line is arranged in the middle of the "active area" of the thin film solar cell, wherein the middle is defined with respect to the width of the thin film solar cell.

In a further embodiment, the second additional conductive line is interrupted, e.g. by the first scribed lines ("P1" scribe) so that no electrical contact between the additional conductive lines and neighboring thin film cells is formed.

The two additional conductive lines may have the same width. In a further embodiment, the width of the second conductive line is greater than the width of the first conductive line. Lateral extensions of the additional conductive line are the width and the length of the additional conductive line, wherein the width of the conductive line is the smaller one of the lateral extensions of the additional conductive line. In a further embodiment, at least an end portion of the at least one additional conductive line is arranged as close as possible to the contact line, which is formed by filling the second scribed line with a conductive material. The distance between the conductive line and the contact line may lie in the range of 50 µm to 1 mm. Preferably a direct electrical contact is formed between the additional conductive line and the contact line.

In a further embodiment, the at least one additional conductive line has a width of 10 µm to 10 cm, preferably a width of 50 to 500 µm, especially preferred a width of 50 to 100 µm, wherein the width of the additional conductive line is in reasonable proportion to the width of the thin film solar cell as well as the "active area" of the thin film solar cell. Moreover, the total area of the additional conductive line is less than the total area of the "active area" of the thin film solar cell.

In a further embodiment, the conductive line has a height within the photoactive layer of 1 to 99% of the height of the photoactive layer. Preferably the height of the conductive line within the photoactive layer is more than 50% of the height of the photoactive layer. The height is the extension of the conductive line or the photoactive layer along a direction connecting the first and the second electrode.

In a further embodiment, the at least one additional conductive line is embedded in a groove, which may be generated by a laser, a mechanical, a chemical or a physical etching process within the "active area" within the photoactive layer. Preferably the groove is generated by a laser process. The groove adjoins the first electrode and extends from the surface of the first electrode into the at least one photoactive layer. If the first electrode comprises layers with different electrical conductivities, the groove preferably adjoins the layer with the highest electrical conductivity, i.e. other layers lying between the photoactive layer and the layer with the highest electrical conductivity are penetrated by the groove. However, it is also possible that the groove does not penetrate these other layers, which may be, for instance, high resistive buffer layers. In this case, the current flow from the additional conductive line within the groove to the layer with the highest electrical conductivity is realized by tunneling or other conducting mechanisms.

In a further embodiment, the groove is at least partially filled with a conductive material to form the at least one additional conductive line. The conductive material may be any material, which has an electrical conductivity higher than the electrical conductivity of the conductive material used as the first electrode, and is preferably a metal, like carbon, silver or copper, or a metal alloy or any other organic conducting polymer or any other inorganic conducting polymer material. In a further embodiment, the conductive material for filling the groove to form the conductive line is identical with the material, which forms the second electrode.

In a further embodiment, the groove is filled with the conductive material up to a height of 1 to 99% within the photoactive layer. Preferably, the groove is filled with the conductive material up to a height of at least 50% within the photoactive layer, most preferably up to a height of 70 to 80% within the photoactive layer.

In a further embodiment, the conductive material, filled into the groove to form the at least one additional conductive line, adjoins the first electrode. Preferably, the conductive line and the first electrode form a direct electrical contact to enable transfer of the charge carriers collected by the conductive line to the first electrode. In a further embodiment, the groove is additionally filled with an insulating material. The insulating material may be any material, which has a low electrical conductivity and prevents current flow between the additional conductive line and the second electrode, preferably an organic or inorganic non-conductive polymer or combinations thereof.

In a further embodiment, the groove is filled with the insulating material, such that 100% of the height within the photoactive layer is reached. This means that the groove penetrates the whole photoactive layer and reaches from the first electrode to the second electrode, wherein is filled with conductive material as described above and with insulating material such that the insulating material is arranged between the conductive material and the second electrode. In the result, the second electrode is electrically insulated from the conductive line. The groove may even extend into the second electrode, wherein the insulating material is arranged in the portion of the groove extending into the second electrode.

The present invention also provides a method to manufacture a thin film device according to the invention. The method comprises the following steps:
 a forming a first electrode,
 b forming a second electrode,
 c forming a photoactive layer between the first and the second electrode, and
 d forming a conductive line within the at least one photoactive layer, wherein the conductive line is electrically interconnected with the first electrode and electrically insulated from the second electrode.

In a further embodiment, step d comprises following steps:
 x forming a groove within the photoactive layer and
 xx at least partially filling the groove with a conductive material such that the conductive material is electrically connected with the first electrode.

In a further embodiment, the groove is only partially filled with a conductive material in step xx and the method further comprises the following step:
 xxx filling the groove with an insulating material to electrically insulate the conductive material from the second electrode.

Partially filling means, that only a part of the whole height of the groove within the photoactive layer is filled with the conductive material. In lateral extension, preferably the whole width of the groove is filled with the conductive material such that the conductive material directly adjoins the photoactive layer.

In a further embodiment, the thin film device according to the invention is manufactured on a suitable substrate by following process steps: forming the first electrode (step a) on the substrate, forming the photoactive layer (step c) on the first electrode, forming the groove within the photoactive layer (step x), partially filling the groove with a conductive material such that the conductive material is electrically interconnected with the first electrode (step xx), filling the remaining groove with an insulating material to electrically insulate the conductive material from the second electrode (step xxx) and finally forming the second electrode (step b) on the photoactive layer and on the insulating material. This process sequence is called superstrate configuration.

In another embodiment, the thin film device according to the invention is manufactured on a suitable substrate by following process steps: forming the second electrode (step b) on the substrate, forming the photoactive layer (step c) on the second electrode, forming the groove within the photoactive layer (step x), filling the groove with a conductive material such that the conductive material is electrically connected with the first electrode (step xx) and finally forming the first electrode (step a) on the photoactive layer and on the conductive material. This process sequence is called substrate configuration. If the groove within the photoactive layer reaches the second electrode, first, the groove is partially filled with an insulating material to electrically insulate the conductive material from the second electrode (step xxx), and then the remaining groove is filled with the conductive material (step xx).

Suitable substrates for the thin film device may be any known to the person skilled, for instance glass substrates or foil substrates, like metal or plastic foil or sheets.

Providing a metal foil or sheet used as substrate for manufacturing the thin film device in the substrate configuration may replace step b, i.e. forming the second electrode.

The first and the second electrode and the photoactive layer may be deposited over the whole substrate surface by various coating technologies known to the skilled person, e.g. by a physical vapor deposition (PVD) process, like a sputtering or an evaporation process, and/or a chemical vapor deposition (CVD) process.

In an embodiment, the filling of the groove with the conductive and/or the insulating material is carried out by a printing process, preferably a screen or inkjet printing process. However, also other known techniques may be used.

In a further embodiment, the filling of the groove with the insulating material may be carried out with a photo resist process comprising the following steps: coating of the photoactive layer and the groove with a photo-resist material, expose and develop the photo-resist material, and removing the photo-resist material from regions other than the groove. The thin film device, manufactured in such a way, comprises at least one additional conductive line, which is electrically connected with the first electrode and electrically insulated from the second electrode and therefore enables collection and transfer of the generated charge carrier to the first electrode to overcome the limitations due to the sheet resistance of the first electrode.

In a further embodiment, the thin film device comprises a first and a second thin film cell and the first electrode, the photoactive layer and the second electrode of the first and the second thin film cells are each formed as a continuous layer. In this case, the method for manufacturing the thin film device comprises the following additional steps:
  i scribing a first line through at least the layer of the first electrode for separation of the first electrodes of individual thin film cells,
  ii scribing a second line parallel to the first lines through the photoactive layer to generate a contact line for interconnection of the first electrode of the first thin film cell with the second electrode of the second thin film cell within the thin film device in one of the following steps,
  iii scribing a third line parallel to the first and the second lines through at least the layer of the second electrode for separation of the second electrodes of individual thin film cells,
  iv filling the first scribed line with an insulating material, and
  v filling the second scribed line with a conductive material to form the contact line for electrical series connection of the individual thin film cells.

In a further embodiment, the first, the second and the third lines are scribed by a laser, a mechanical or a chemical etching process, which is integrated in the manufacturing process of the thin film device. Preferably the first, the second and the third lines are scribed by a laser process.

In a further embodiment, the first and the second scribed lines are scribed by a laser process and the third lines are scribed by a mechanical scribing process. Advantageously, by scribing the third lines by a mechanical scribing process.

In an embodiment, filling the first line with an insulating material, is carried out by a printing process, preferably an inkjet or screen printing process.

The steps x, xx and xxx as well as step i and ii may be performed in any possible order.

Advantageously, for improving the efficiency of a thin film device production line, the additional step ii and step x are performed subsequent to each other in any order, i.e. step ii follows step x or step x follows step ii, wherein the first one of these steps follows step c. Preferably, the steps ii and x directly follow each other. Thus, the second lines and the groove within the photoactive layer may be scribed in one manufacturing step by the same scribing tool within the thin film device production line.

In a further embodiment, additional step i follows step xx. Advantageously, step i automatically causes the interruption of an additional conductive line, which extends non-parallel to the three scribed lines and crosses them and therefor prevents shunting of the thin film device.

In a further embodiment, step xxx and additional step iv, i.e. filling the groove and the first line with the insulating material, are carried out in one manufacturing step by the same printing tool within the thin film device production line.

In a further embodiment, step b automatically causes the filling of the second line with the material of the second electrode, which is additional step v, such that both steps are carried out by one manufacturing step to form the contact line for electrical series connection of the individual thin film cells such that no separate manufacturing step is needed. Subsequently, additional step iii is performed.

In a further embodiment, filling the second line with a conductive material is carried out by a printing process.

Advantageously, realization of the thin film device manufacturing process in the way described above, lowers the manufacturing costs: only two laser scribing tools are necessary in the thin film device production line: one laser scribing tool for scribing the second line and the groove or grooves for the additional conductive line in one manufacturing step and another laser scribing tool for scribing the first line, while the third line are preferably scribed by a mechanical process.

Furthermore advantageously, freedom in thin film module design is increased by enabling manufacturing thin film modules with improved filling factor by changing the individual thin film cell width by including additional conductive lines in the "active area" of the thin film solar cell. The electrical output parameters of the thin film module can be adjusted in a wide range by variation of the thin film cell size. A thin film module with customized open circuit voltage ($V_{cc}$) output can be produced without any loss in filling factor of the thin film solar cell. The filling factor of the thin film module can even be advantageously enhanced by the provided inventive idea.

FIGURES

FIG. 1 schematically shows an exemplary thin film cell with neighboring thin film cells in cross section.

FIG. 2A schematically shows an exemplary thin film device in top view according to the present invention.

FIG. 2B schematically shows a detailed section of the additional conductive lines of FIG. 2A.

FIG. 2C schematically shows different possible arrangements of the additional conductive lines within the thin film cell.

Figure 3:
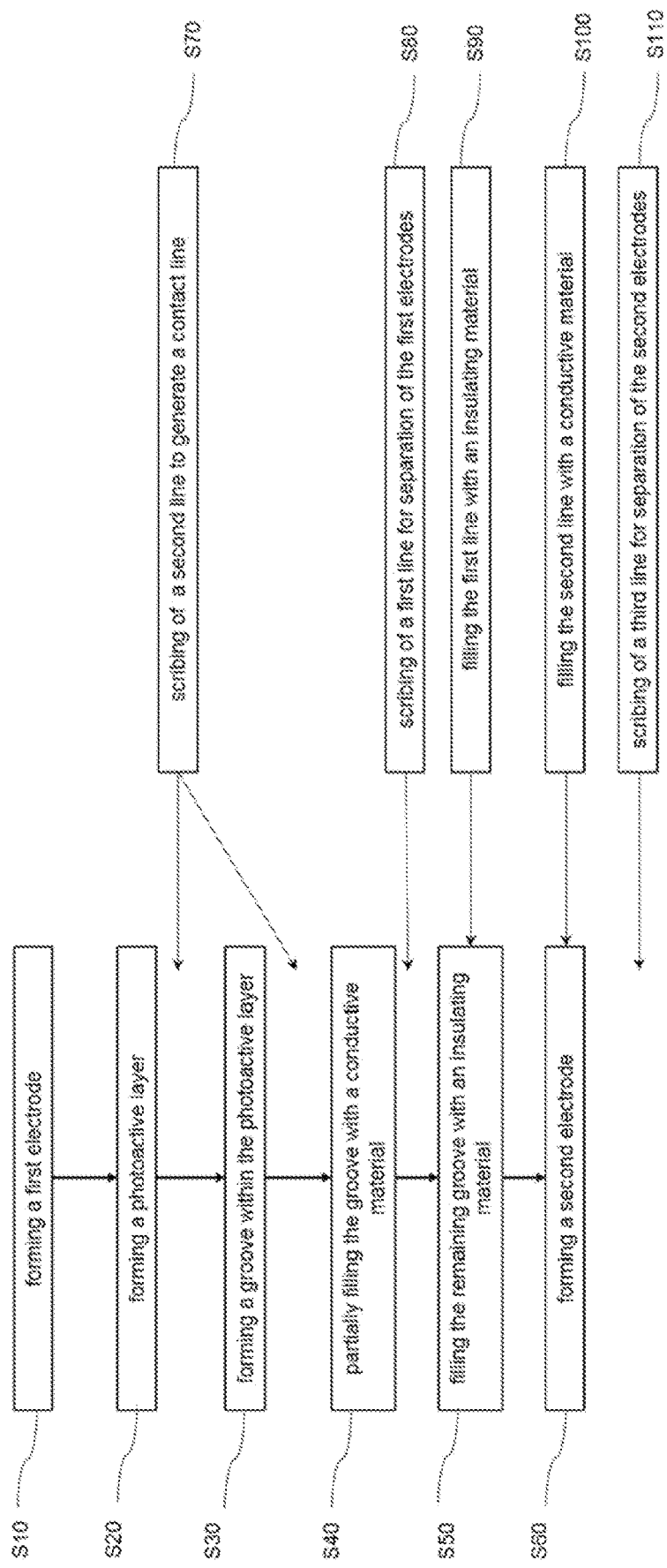

FIG. 3 schematically shows an embodiment of the method according to the present invention, wherein additional steps S70, S80, S90, S100 and S110 are included in the manufacturing process to produce the thin film device in a superstrate configuration with additional conductive lines according to the present invention.

EXEMPLARY EMBODIMENTS

The thin film device and the method to manufacture the thin film device according to the invention is explained in the following exemplary embodiment, wherein the figures are not intended to imply a restriction to the shown embodiments.

FIG. 1 shows in cross section a thin film cell 100 completely and two neighboring thin film cells 100a, 100b partially. The thin film cell comprises a first electrode 101, at least one photoactive layer 102 and a second electrode 103. Three scribed lines 105, 106, 107 for physically separating and electrically connecting a plurality of thin film cells 100, 100a, 100b to a thin film module are visible, defining an "active area" 108 and a "dead area" or scribing region 109 of the thin film cell 100. Also visible is a groove 104 within the photoactive layer, which is filled with a conductive material to form an additional conductive line 104a within the "active area" of the thin film cell 100. The conductive line 104a forms a direct contact with the first electrode 101. In addition, the groove is filled with an insulating material 104b to electrically insulate the conductive line from the second electrode 103. A first scribed line 105 separates the first electrode 101 into individual thin film cells 100, 100a, 100b and is filled with an insulating material 105a. A second scribed line 106 through the at least one photoactive layer is generated and filled with a conductive material 106a to form a contact line 106b. The contact line 106b connect the thin film cell 100a with the thin film cell 100 in series, that means the second electrode 103 of the thin film cell 100a is electrically connected to the first electrode 101 of the thin film cell 100. A third scribed line 107 separates the second electrode 103 into individual thin film cells 100, 100a, 100b. The third scribed line 107 may penetrate the second electrode 103 and the photoactive layer 102 thereby reaching the first electrode 101 as shown in FIG. 1 or may penetrate only the second electrode 103.

FIGS. 2A to 2C show top views on exemplary thin film devices. FIG. 2A shows an exemplary thin film module 200 in top view comprising a plurality of individual thin film cells 203 divided by several sets 201 of three scribed lines and with additional conductive lines 202, 202a. A first additional conductive line 202 is arranged parallel to the set 201 of three scribed lines within each thin film cell 203. A second additional conductive line 202a is arranged perpendicular to the set 201 of three scribed lines.

FIG. 2B shows a detailed marked section of FIG. 2A wherein one set 201 of three scribed lines is split up into a first scribed line 201a, a second scribed line 201b and a third scribed line 201c. The second additional conductive line 202a, which is perpendicular to the three scribed lines 201a-201c is interrupted by the first scribed line 201a such, that no electrical contact between the additional conductive lines 202, 202a of one thin film cell 203 and neighboring thin film cells is formed. In the result, additional conductive lines 200 and 202a contribute to the charge collection and transfer only in that thin film cell 203 in which they are arranged. The conductive line 202a makes electrical contact with 201b.

FIG. 2C shows different exemplary arrangements of the additional conductive lines 202, 202a within the thin film cell 203. The lower part of FIG. 2C shows an arrangement, wherein the first additional conductive line 202 forms a zig-zag-pattern within the thin film cell 203. The middle part of FIG. 2C shows an arrangement, wherein the first additional conductive line 202 within the thin film cell 203 comprises a line parallel to the set 201 of three scribed lines and several shorter lines, which cross the parallel line. The upper part of FIG. 2C shows an arrangement, wherein the first additional conductive line 202 comprises a curved line and a crossing additional short line, which is perpendicular to the set 201 of three scribed lines.

Apart from the description, the additional conductive lines can have many different design patterns and lengths in a thin film module. Moreover, the arrangement and number of the additional conductive lines within the active area of a single thin film solar cell can be chosen according to simulation results in order to achieve higher yields. Increasing the number of additional conductive lines will increase the thin film module efficiency via increase in filling factor of the thin film solar cell.

FIG. 3 shows an embodiment of the method to manufacture the thin film device according to the present invention, wherein the thin film device is produced in the superstrate configuration. The method comprises the following steps: S10 forming a first electrode on a suitable substrate, S20 forming a photoactive layer on the first electrode, S30 forming a groove within the photoactive layer within the "active area" of the thin film cell, S40 partially filling the groove with a conductive material to form an additional conductive line, S50 filling the remaining groove with an insulating material and S60 forming a second electrode on the photoactive layer and the insulating material within the groove. The method may further comprise additional steps S70 to S110. S70 is scribing a second line to generate a contact line for series connection of the individual thin film cells to a thin film module and may be carried out either between S20 and S30 or between S30 and S40 such, that forming the groove and the second scribed line can be carried out in one manufacturing step with the same scribing tool. S80 is scribing a first line to separate the first electrodes into individual thin film cells and follows S40. It automatically causes the interruption of any additional conductive line crossing the "dead area" of the thin film cell. S90 is filling the first scribed line with an insulating material and is carried out in one manufacturing step together with S50 by the same printing tool. S100 is filling the second scribed line with a conductive material and is performed automatically by S60, if the second electrode is formed by a large-area deposition process. In this case, both steps are carried out by one manufacturing step and the conductive material within the second line, i.e. the contact line, and the material of the second electrode are the same. S110 is scribing of the third line to separate the second electrode into individual thin film cells and is carried out after S60.

For realization of the invention it is advantageous to combine the described embodiments and features of the claims as described above. However, the embodiments of the invention described in the foregoing description are examples given by way of illustration and the invention is nowise limited thereto. Any modification, variation and equivalent arrangement as well as combinations of embodiments should be considered as being included within the scope of the invention.

CITED LITERATURE

[1] Guillén C. et al "TCO/metal/TCO structures for energy and flexible electronics", Thin Solid Films 520 (2011) 1-17

REFERENCE SIGNS 100 thin film cell
100a neighboring thin film cell
100b neighboring thin film cell
101 first electrode
102 at least one photoactive layer
103 second electrode
104 groove within the at least one photoactive layer
104a additional conductive line
104b insulating material for filling the groove
105 first scribed line
105a insulating material for filling the first scribed line
106 second scribed line
106a conductive material for filling the second scribed line
106b contact line for series connection of neighboring thin film cells
107 third scribed line
108 "active area" of the thin film cell
109 "dead area"/scribing region of the thin film cell
200 thin film module
201 set of three scribed lines
201a first scribed line
201b second scribed line
201c third scribed line
202 first additional conductive line
202a second additional conductive line
203 thin film cell of a certain width

The invention claimed is:

1. A thin film device comprising at least one thin film cell, wherein the thin film cell comprises a first electrode, a photoactive layer and a second electrode, wherein the photoactive layer is arranged between the first and the second electrode,
  at least one additional conductive line is arranged within an active area of the thin film cell and included in the photoactive layer and electrically interconnected with the first electrode and electrically insulated from the second electrode;
  wherein the at least one additional conductive line is embedded in a groove, which is formed within the active area of the photoactive layer to penetrate the whole photoactive layer from the first electrode to the second electrode, and
  wherein, over the entire height of the photoactive layer, the groove is filled with a conductive material having a height within the groove of at least 50% of the height of the photoactive layer and is additionally filled with an insulating material until reaching 100% of the height of the photoactive layer.

2. The thin film device according to claim 1, wherein the first electrode is made of a transparent conductive material.

3. The thin film device according to claim 1, wherein the at least one additional conductive line has a width of 10 μm to 10 cm.

4. The thin film device according to claim 1, wherein the insulating material is arranged between the conductive material and the second electrode and wherein the conductive material adjoins the first electrode.

5. The thin film device according to claim 1, wherein the thin film device comprises a plurality of thin film cells connected in series, wherein the first electrode of a first cell is electrically interconnected to the second electrode of a second cell by a contact line and wherein at least one conductive line is electrically interconnected to the contact line.

6. The thin film device according to claim 1, wherein the at least one additional conductive line has a height within the photoactive layer of 70 to 80% of the height of the photoactive layer.

7. The thin film device according to claim 1, wherein the groove is formed by a laser, a mechanical, a chemical or a physical etching process within the active area of the photoactive layer.

* * * * *